(12) United States Patent
Duan et al.

(10) Patent No.: US 12,004,287 B2
(45) Date of Patent: Jun. 4, 2024

(54) PRINTED CIRCUIT BOARD

(71) Applicant: Telefonaktiebolaget LM Ericsson (publ), Stockholm (SE)

(72) Inventors: Pinghua Duan, Nanjing (CN); Lei Zhang, Nanjing (CN); Zhan Ying, Nanjing (CN)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 204 days.

(21) Appl. No.: 17/789,276

(22) PCT Filed: Feb. 6, 2020

(86) PCT No.: PCT/CN2020/074418
§ 371 (c)(1),
(2) Date: Jun. 27, 2022

(87) PCT Pub. No.: WO2021/155530
PCT Pub. Date: Aug. 12, 2021

(65) Prior Publication Data
US 2023/0051976 A1 Feb. 16, 2023

(51) Int. Cl.
*H05K 1/11* (2006.01)
*H05K 1/02* (2006.01)

(52) U.S. Cl.
CPC ........... *H05K 1/0206* (2013.01); *H05K 1/116* (2013.01); *H05K 2201/10242* (2013.01)

(58) Field of Classification Search
CPC .... H05K 1/184; H05K 1/0204; H05K 1/0206; H05K 1/113; H05K 1/116
See application file for complete search history.

(56) References Cited

U.S. PATENT DOCUMENTS

2006/0007661 A1    1/2006  Iketaki
2018/0183160 A1    6/2018  Shiomi

FOREIGN PATENT DOCUMENTS

| CN | 202425200 U | 9/2012 |
| CN | 102724807 A | 10/2012 |
| CN | 102869193 A | 1/2013 |
| CN | 104576575 A | 4/2015 |
| CN | 209526941 U | 10/2019 |
| EP | 1962566 A2 | 8/2008 |

OTHER PUBLICATIONS

EPO Communication with Supplementary European Search Report dated Dec. 4, 2023 for Patent Application No. 20917775.7, consisting of 7-pages.
International Search Report an Written Opinion dated Nov. 10, 2020 for International Application No. PCT/CN2020/074418 filed Feb. 6, 2020, consisting of 8-pages.

*Primary Examiner* — Jeremy C Norris
(74) *Attorney, Agent, or Firm* — Weisberg I.P. Law, P.A.

(57) ABSTRACT

The present disclosure provides a printed circuit board with a plated through hole. The through hole covered by a solder pad at both ends of the through hole. At least two pins are plugged into the through hole, one of which with its head end being thermal contacted with one of the solder pads. Another pin's head end being thermal contacted with the other solder pad. The at least two pins are thermal contacted with one another. Thermal dissipation rate is increased with the structure of the through hole.

16 Claims, 5 Drawing Sheets

US 12,004,287 B2

PRINTED CIRCUIT BOARD

CROSS-REFERENCE TO RELATED APPLICATIONS

This application is a Submission Under 35 U.S.C. § 371 for U.S. National Stage Patent Application of International Application Number: PCT/CN2020/074418, filed Feb. 6, 2020 entitled "A PRINTED CIRCUIT BOARD," the entirety of which is incorporated herein by reference.

FIELD OF THE INVENTION

The present disclosure generally relates to physical construction, and more specifically, to a printed circuit board with through holes for heat dissipation.

BACKGROUND

Component heat dissipation is important for printed circuit board, PCB, especially critical for high power electronic equipment or device, for example, power amplifier, and also for temperature sensitive electronics. Embedded coin in PCB and plated through hole are typical thermal dissipation solutions.

Using the high thermal conductivity of copper coin, the heat generated by the parts in the PCB is transferred to copper coin quickly, and then dispersed in the air through the copper coin. However, embedded coin is quite expensive and complicated compared to plated through hole thus inventors try to find out a way for improving the latter solution. FIG. 1 illustrates an exemplary structure of the heat transmission pin in a through hole of a PCB. PCB 100 has a through hole 110. In order to transmit heat between the lower surface and the upper surface of the PCB 100, inner surface of the through hole 100 is plated with thermal conductive metal such as copper, and solder pad (not shown in FIG. 1) is placed at each end of the through hole 110. After the copper layer being the inner surface of the plated through hole, heat can be conducted through the solder pads via the copper inner surface of the through hole 110.

There's still a need to further decrease thermal resistance especially for through hole array, mainly due to the density of through holes of the PCB and thickness of through hole plated layer. The through hole arrays are mostly used for high power component thermal dissipation, on which the copper inner surface of the through holes is the main heat transfer path. Density of those holes is limited due to drill process limitation. The total copper layer dissipation rate is hard to be improved to a wanted level.

SUMMARY

In view of the foregoing, an object of the present disclosure is to increase heat dissipation by plated through hole in a PCB. Herein, the present disclosure proposes a printed circuit board with pins plugged into a through hole.

In accordance with one aspect of the present application, it provides a printed circuit board comprising a plated through hole covered by a solder pad at both ends of the through hole. The at least two pins are plugged into the through hole, one of which with its head end being thermal contacted with one of the solder pads. Another pin's head end being thermal contacted with the other solder pad. The at least two pins are thermal contacted with one another.

In some embodiments, at least one of the pins has interference fit with the inner surface of the plated through hole.

In some embodiments, at least one of those pins comprises a body and a tuber close to the head end of the pin. The tuber is at one side of the body, other than a side which it is thermal contact with another pin.

In a further embodiment, the tuber is made of glue or metal.

In some embodiments, each of the pins comprises a chamfer at tail end.

In some embodiments, there're two pins are plugged into the through hole. Further, each of the two pins has semi-cylinder body, and they are thermal contacted with each other by rectangle surface of the semi-cylinder body.

With heat transfer path provided by the thermal contacted pins, thermal resistance between solder pads at both ends of a through hole can be reduced. Heat dissipation rate is improved especially for through hole arrays in a PCB.

BRIEF DESCRIPTION OF THE DRAWINGS

The disclosure itself, the preferable mode of use and further objectives are best understood by reference to the following detailed description of the embodiments when read in conjunction with the accompanying drawings, in which.

DETAILED DESCRIPTION

The embodiments of the present disclosure are described in detail with reference to the accompanying drawings. It should be understood that these embodiments are discussed only for the purpose of enabling those skilled persons in the art to better understand and thus implement the present disclosure, rather than suggesting any limitation on the scope of the present disclosure. Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Furthermore, the described features, advantages, and characteristics of the disclosure may be combined in any suitable manner in one or more embodiments. One skilled in the relevant art will recognize that the disclosure may be practiced without one or more of the specific features or advantages of a particular embodiment. In other instances, additional features and advantages may be recognized in certain embodiments that may not be present in all embodiments of the disclosure.

As used herein, the terms "first", "second" and so forth refer to different elements. The singular forms "a" and "an" are intended to include the plural forms as well, unless the context clearly indicates otherwise. The terms "comprises", "comprising", "has", "having", "includes" and/or "including" as used herein, specify the presence of stated features, elements, and/or components and the like, but do not preclude the presence or addition of one or more other features, elements, components and/or combinations thereof. The term "based on" is to be read as "based at least in part on". The term "one embodiment" and "an embodiment" are to be read as "at least one embodiment". The term "another embodiment" is to be read as "at least one other embodiment". Other definitions, explicit and implicit, may be included below.

In the following, various embodiments of the present disclosure will be described with reference to the accompany figures.

In order to improve heat dissipation rate, to insert thermal conductive material in through holes of the holes array is a possible solution.

Figure 1:
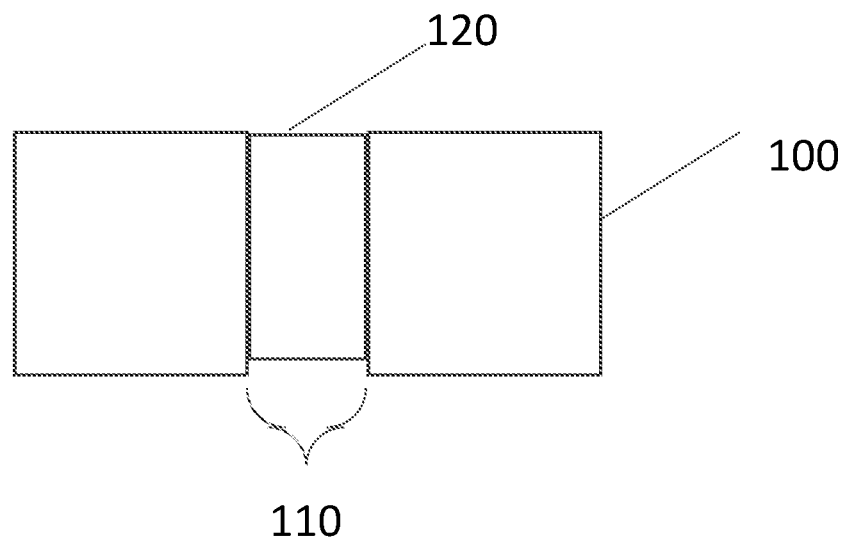
FIG. 1 illustrates a structure of a plated through hole in PCB for heat dissipation according to a current solution.
Figure 2:
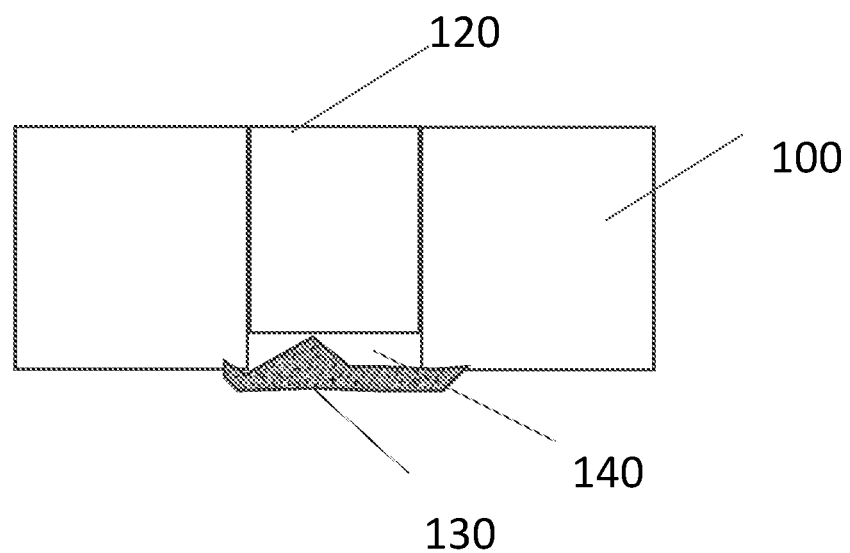
FIG. 2 shows a partial enlarged view of FIG. 1 where there is very limited contact between the inserted cylinder pin and the solder pad.

Referring to FIG. 1, a copper cylinder 120 is plugged into a plated through hole 110 before the solder pad is soldered. With tight contact between inner surface of the through hole 110 and the copper cylinder 120, contact area of those thermal conductive material is enlarged, causing a decrease of thermal resistance. However, considering tolerance factor, the length of the cylinder 120 has to be designed less than the depth of the through hole 110, or else the cylinder will protrude out of the surface of the PCB. Therefore, room 140 is unavoidably left in the through hole 110 after the solder pad 130 is soldered, as shown in FIG. 2, a partial enlarged view of FIG. 1. The room 140 left would be considerable because of surface tension of the molten solder paste. What's more, when the diameter of the through hole is large, solder paste might be not enough to fill the gap left by the plugged cylinder. Inventors found that heat is low-efficiently transferred via point contact between the cylinder and the solder pad, shown in FIG. 2. Or even worse, the solder pad is contactless with the cylinder.

According to an embodiment of the disclosure, a PCB structure comprising a plated through hole is introduced. A plated through hole refers to a through hole plated with metal such as copper layer on the inner surface of the through hole. At least 2 pins are plugged into the plated through hole, one of the pins being thermal contacted with a solder pad covering an end of the through hole via its head end, another of the pins being thermal contacted with a solder pad covering the other end of the through hole via its head end. Further, the at least 2 pins are thermal contacted with one another.

Thermal contact between a solder pad and a pin is achieved by solder paste soldered on bonding pad at an end of the through hole. With the introduced structure in the embodiment, the at least two pins plugged into the through hole are respectively thermal contacted with both of the solder pads, together with thermal contact between the at least two pins. Therefore, heat transmission by the contacts is quite effective because of the guaranteed contacts.

Since the pins are thermal contacted with one another, heat can be conducted from a solder pad on one surface of the PCB to a solder pad on the other surface, via not only the inner copper layer, but the contact area between those pins. As a result, thermal resistance is decreased. Note that a premise of the decreased thermal resistance is the maintenance of thermal contact between those at least 2 pins, and the larger the contact area, the higher rate of the heat dissipation.

Figure 3:
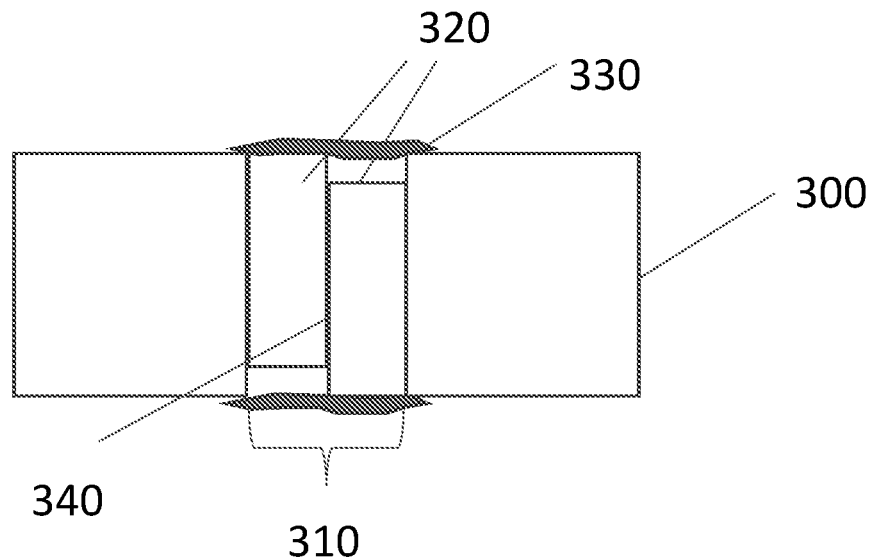
FIG. 3 illustrates an exemplary structure of a through hole in PCB for heat dissipation at a side section according to embodiments of the present disclosure.
Figure 4:
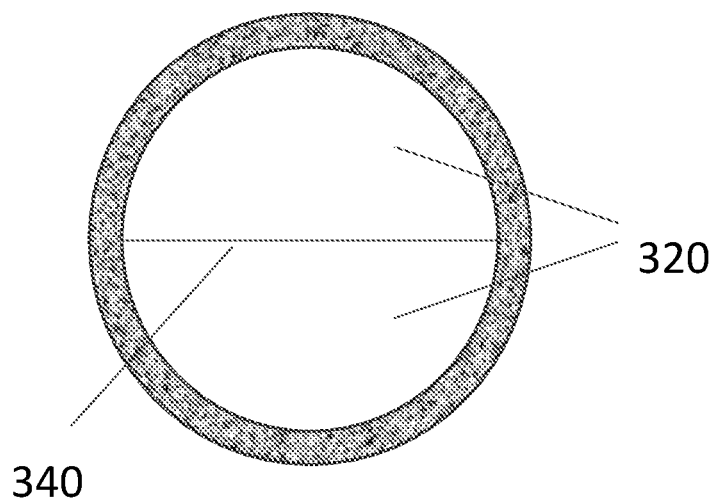
FIG. 4 shows a cross-cutting section of the plated through hole in the exemplary structure illustrated in FIG. 3 at a top view.

In a detailed embodiment of a printed circuit board is introduced hereinafter. A PCB comprises multiple plated through holes and we take structure of a through hole as an example. Referring to FIG. 3 which shows a side section of a PCB 300, a through hole 310 is in the middle with 2 pins 320 being plugged into the through hole 310. Referring to FIG. 4 showing a cross-cutting of the through hole 310, on which a grey circular ring as copper layer is plated internally, the 2 pins 320 both have a semi-cylinder body, which enable them to have a considerably large contact area with each other via their rectangle surfaces 340.

Go back to FIG. 3, although there may be room left in the through hole 310 after solder pad is soldered, at least the head ends of the 2 pins 320 are respectively thermal contacted with corresponding solder pad 330. With the 2 pins having big contacting area 340 with each other, heat can be dissipated from one to the another, and thermal resistance between the two solders pad is reduced. Note that it can also be utilized when heat need to be transferred from a middle layer of the PCB to a surface, since the middle layer is tightly thermal contacted with one of the pins. Compared to embedded coin, the inserted pins have a rather low cost for heat dissipation.

For the maintenance of an efficient heat dissipation path introduced above, thermal contact between those pins should be ensured. In a further embodiment, a tight contact between the 2 pins is preferred. Interference fit between the pins and the inner surface of the through hole can ensure the tight contact between the pins. It is ideally no need for interference fit to ensure the tight contact, however, considering tolerance of inner size of the through hole and thickness of plated metal on the through hole, interference fit would practically be helpful for tight contact.

An option is a bit deformation of the pins. Taking 2 semi-cylinder pins as an example, before being plugged, the pins are clamped towards a bit semi-ellipse. Then the longer diameter is a bit larger than the inner size of the through hole before being pressed into the hole. With mechanical pressure, the pins are plugged into the hole with interference fit till the head end of the pins gets even with the surface of the board.

Figure 5A:
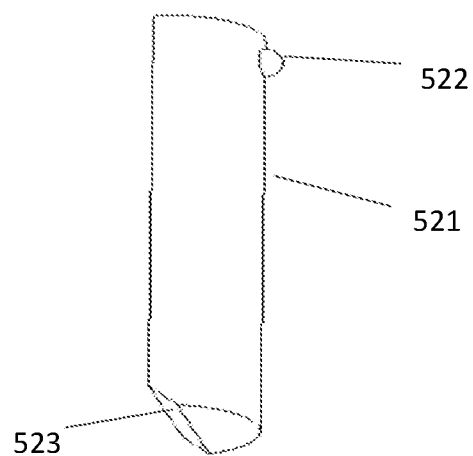
FIG. 5A shows a stereogram of one of the pins according to embodiments of the present disclosure.

An alternative is shown in FIG. 5A that a pin comprises a body 521 and a tuber 522 close to the head end of the pin. The tuber is at one side of the body, while other side(s) of the body is (are) thermal contact with anther pin plugged into the hole. Under the circumstance that the body of the pin is a semi-cylinder, the tuber is at arc surface of the pin. FIG.

5B shows the two pins' relative locations in a through hole. When plugged into the through hole shown in FIG. 5C in a cross-section view, the tuber may have interference fit with the internal surface of the hole, pushing the plane surface of the pin to an opposite direction thus tightly contacted with the plane surface of the other pin. It is noted that it is not necessary to have both pins with a structure either with a tube or a semi-ellipse body. One of the two pins plugged into a hole is enough to ensure a tight contact between the two pins.

In a further embodiment, the tuber is made of metal which is integrative with the body or added onto the body. So, the tuber can be different of the material from the body of the pins. The tuber can also be made of glue whose elasticity provides pressure that helping tight contact between the pins. In that case, the pins can be tightly contacted with another pin without interference fit.

Figure 5B:
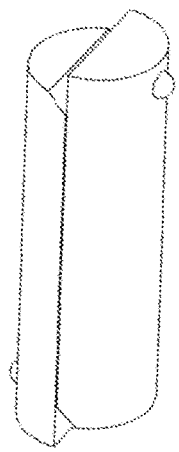
FIG. 5B shows a stereogram of combination of two pins illustrated in FIG. 5A in a through hole.
Figure 5C:
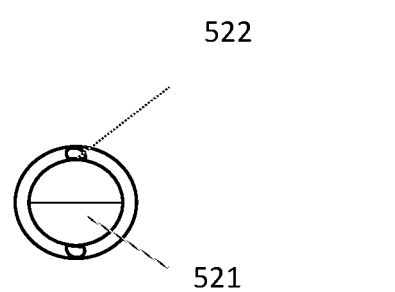
FIG. 5C shows a cross section view of combination of two pins illustrated in FIG. 5A after plugged into a plated through hole.

To make the pins easily plugged into the hole, chamfer 523 at the tail end of the pin is introduced in an embodiment, as also shown in FIG. 5. Note that the chamfer does not necessarily accompany with the tuber since they provide respective benefit, while a pin with a tuber close to one end and a chamfer at the other end would be a preferred embodiment.

Note that a head end or a tail end of a pin mentioned in this disclosure does not need to be specific. If one end is considered as head end, the other end should be considered as tail end.

Figure 6A:
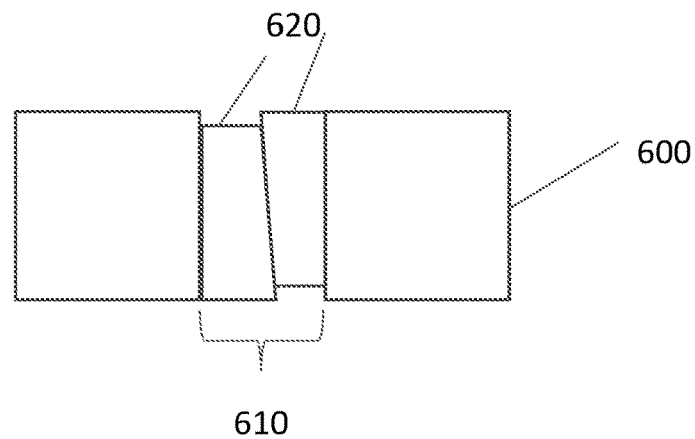
FIG. 6A shows a longitudinal section view of combination of two pins after plugged into a plated through hole according to some embodiments of the present disclosure.

As a deformation of the above-mentioned semi-cylinder pin, FIG. 6A shows an alternative shape in a longitudinal section after being plugged into a through hole. Longitudinal section of the pin 620 is a trapezoid which provides larger contact area with the solder pad (not shown). Room left in the through hole 610 of the PCB 600 is less than that of the semi-cylinder embodiment. Therefore, thermal dissipation rate is further improved.

Figure 6B:
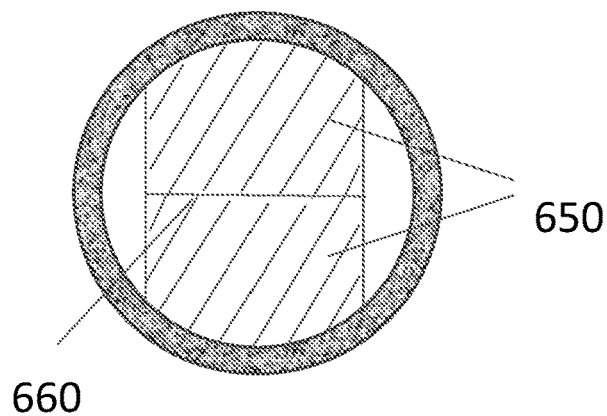
FIG. 6B shows a cross section view of combination of two pins after plugged into a plated through hole according to some embodiments of the present disclosure.

As another deformation of the above-mentioned semi-cylinder pin, FIG. 6B shows an alternative shape in a cross-section after being plugged into a through hole. The pin 650 does not need to have an intact semi-cylinder body, as long as thermal contact 660 with the other pin can be ensured, and thermal contact with a solder pad at an end of the through hole can be ensured.

Figure 7:
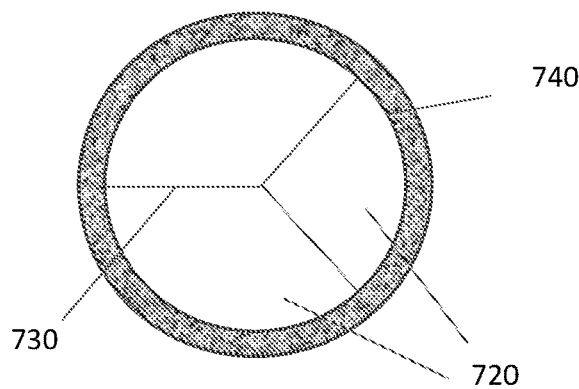
FIG. 7 shows a cross section view of combination of three pins after plugged into a plated through hole according to some embodiments of the present disclosure.

As an alternative of the 2-pin structure in a through hole, 3 pins are provided in another embodiment. FIG. 7 shows a cross section of the hole and the pins 720 plugged into the hole. Tubers can be added which may add interference fit with the inner surface 740 of the hole, to help provide pressure for tight contact among those pins at contact planes 730. One of those pins' heads is soldered with a solder pad at an end of the through hole, the other two's heads are soldered with a solder pad at the other end of the hole.

In the above-mentioned embodiments, in order to transfer heat among pins and solder pads, at least main body of the pins is required to be made of heat conductive material, such as silver, copper, gold, aluminum, or alloy. Considering multiple factors such as cost, weight and stiffness, albronze or copper aluminum alloy is more likely to be used for the pins.

Figure 8:
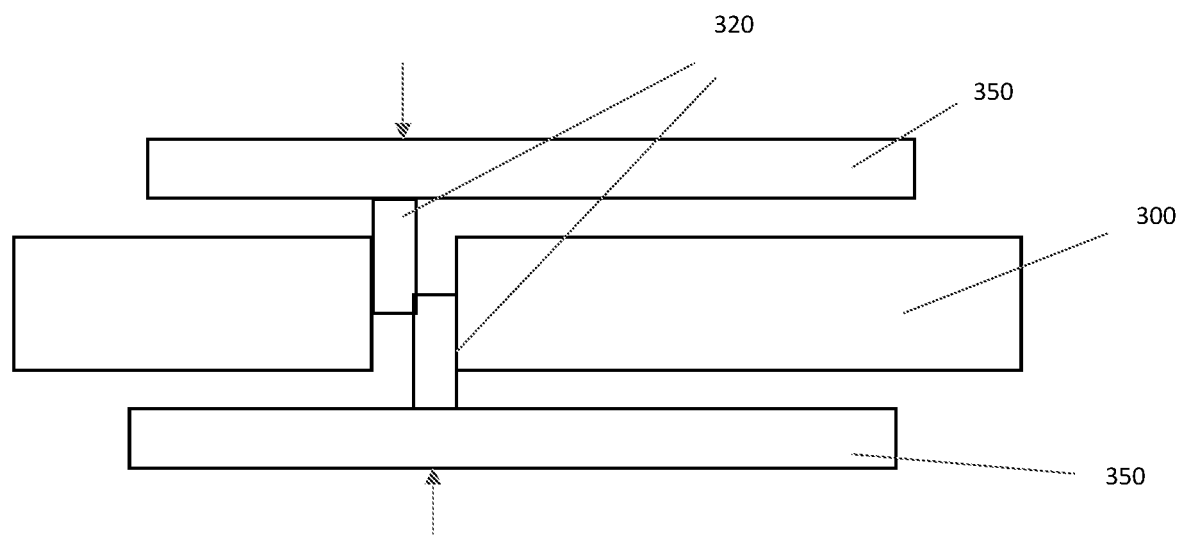
FIG. 8 illustrates a method for assembling the pins into the through hole according to some embodiment of the present disclosure.

A method of implementing the structure of the PCB is provided shown in FIG. 8.

First, to insert the pins from each side of board.

Secondly, to press the pins with a fixture until the pin surface is even with the board. If with a tube, the tube will provide force to avoid the pin from falling out of the through hole.

Thirdly, to solder the through hole as normal process. The solder paste could more likely fill up the room left by the shorter length of pin short than that of through hole, because the room left after the second step in the embodiment is smaller than the room of with only one cylinder plugged into the through hole. And less solder paste is needed for filling in the room.

After that, assemble a component which needs thermal transmission at one of the solder pads with thermal interface material.

Note that to insert the pins from each side of board in the first step is to ensure thermal contact between the head end of the pin and the solder pad soldered in the third step. Since the pins need to be pressed by a fixture into the hole in the second step in order to ensure thermal contact with another pin, the pin could be pressed into the hole with its head end at most even with the surface of the PCB. Therefore, a solder paste is easy to be soldered onto the head end of the pin when covering the through hole.

Alternatively, if at least one of the multiple pins has a structure with a tuber, the multiple pins could be inserted into the hole from a same side of the board in a certain order. Taking 2-pin structure as an example, a first pin is firstly put into the through hole with its head down, followed by a second pin being pressed into the hole with its head upwards. Because of the tuber on either the first or the second pin, the second pin is stopped before it totally gets into the through hole, although its length is shorter than the depth of the hole. Then, mechanical force is needed to press the second pin until its head is even with the surface of the board. In another example of a 3-pin structure scenario, the first 2 pins are put into the hole with their heads down, and then the last pin is pressed from a same side with its head upwards.

Under either method introduced above, mechanical force needs to be used for pressing the pins into the through hole to achieve tight thermal contact between/among the pins. Therefore, the pins could only stop at the surface of the board, ensuring thermal contact of the pins with the solder pads. Thermal dissipation path from a solder pad to a pin, then another pin to another sold pad, is well established to increase heat transmission rate of the PCB.

The present disclosure is described above with reference to the embodiments thereof. However, those embodiments are provided just for illustrative purpose, rather than limiting the present disclosure. The scope of the disclosure is defined by the attached claims as well as equivalents thereof. Those skilled in the art can make various alternations and modifications without departing from the scope of the disclosure, which all fall into the scope of the disclosure.

The invention claimed is:

1. A printed circuit board, PCB, comprising:
   a plated through hole;
   a solder pad covering the through hole at both ends of the through hole; and
   at least two pins plugged into the through hole, each of the at least two pins having a pin head end, one of the at least two pin head ends being in thermal contact with one of the solder pads, and another of the at least two pin head ends being in thermal contact with the other solder pad, the at least two pins being thermal contacted with one another.

2. The PCB according to claim 1, wherein a pin of the at least two pins further comprises a body and a tuber proximate its head end, wherein the tuber is at one side of the body, other than a side which it is thermal contact with another pin.

3. The PCB according to claim 2, wherein the tuber is made of glue.

4. The PCB according to claim 2, wherein the tuber is made of metal.

5. The PCB according to claim 2, wherein a pin of the at least two pins has an interference fit with inner surface of the plated through hole.

6. The PCB according to claim 5, wherein each of the at least two pins further comprises a tail end, each tail end comprising a chamfer.

7. The PCB according to claim 5, wherein there are two pins plugged into the through hole.

8. The PCB according to claim 2, wherein each of the at least two pins further comprises a tail end, each tail end comprising a chamfer.

9. The PCB according to claim 8, wherein there are two pins plugged into the through hole.

10. The PCB according to claim 2, wherein there are two pins plugged into the through hole.

11. The PCB according to claim 1, wherein a pin of the at least two pins has an interference fit with inner surface of the plated through hole.

12. The PCB according to claim 1, wherein each of the at least two pins further comprises a tail end, each tail end comprising a chamfer.

13. The PCB according to claim 1, wherein there are two pins plugged into the through hole.

14. The PCB according to claim 13, wherein each of the two pins has a semi-cylinder body having a rectangular surface, wherein the two pins are in thermal contact with each other through the rectangle surface of the semi-cylinder body.

15. A printed circuit board, PCB, comprising:
   a plated through hole;
   a solder pad covering the through hole at both ends of the through hole; and
   two pins plugged into the through hole, each of the two pins having:
      a pin head end, one of the at least two pin head ends being in thermal contact with one of the solder pads, and another of the at least two pin head ends being in thermal contact with the other solder pad, the two pins being in thermal contact with one another, a first pin of the two pins further comprises a body and a tuber proximate its head end, the tuber being made of glue and the tuber being at one side of the body other than a side which it is thermal contact with the other pin, a pin of the two pins having an interference fit with inner surface of the plated through hole; and
      a tail end, each tail end comprising a chamfer.

16. The PCB according to claim 15, wherein each of the two pins has a semi-cylinder body having a rectangular surface, wherein the two pins are in thermal contact with each other through the rectangle surface of the semi-cylinder body.

\* \* \* \* \*